United States Patent
vor dem Brocke et al.

(10) Patent No.: US 11,777,508 B2
(45) Date of Patent: Oct. 3, 2023

(54) DEVICE AND METHOD FOR SYNCHRONIZING A HIGH FREQUENCY POWER SIGNAL AND AN EXTERNAL REFERENCE SIGNAL

(71) Applicant: Comet AG, Flamatt (CH)

(72) Inventors: Manuel vor dem Brocke, Bramsche (DE); Roland Schlierf, Frechen (DE); André Grede, Bern (CH); Daniel Gruner, Müllheim (DE)

(73) Assignee: COMET AG, Flamatt (CH)

( * ) Notice: Subject to any disclaimer, the term of this patent is extended or adjusted under 35 U.S.C. 154(b) by 0 days.

(21) Appl. No.: 17/686,665

(22) Filed: Mar. 4, 2022

(65) Prior Publication Data

US 2022/0190835 A1 Jun. 16, 2022

Related U.S. Application Data

(63) Continuation of application No. 16/904,629, filed on Jun. 18, 2020, now Pat. No. 11,489,531.

(30) Foreign Application Priority Data

Jun. 25, 2019 (EP) .................................... 19182214

(51) Int. Cl.
*H03L 7/099* (2006.01)
*H03L 7/093* (2006.01)
*H03L 7/189* (2006.01)

(52) U.S. Cl.
CPC ............ *H03L 7/0992* (2013.01); *H03L 7/093* (2013.01); *H03L 7/189* (2013.01)

(58) Field of Classification Search
CPC ..... H03L 7/099; H03L 7/0991; H03L 7/0992; H03L 7/0814; H03L 7/0816; H03L 7/07; H03L 1/1022; H03L 7/093; H03L 7/189; H03L 7/191
See application file for complete search history.

(56) References Cited

U.S. PATENT DOCUMENTS

| | | | |
|---|---|---|---|
| 5,774,509 A | 6/1998 | Frigerio et al. | |
| 6,111,471 A | 8/2000 | Bonneau et al. | |
| 6,198,353 B1 | 3/2001 | Janesch et al. | |
| 7,250,823 B2 | 7/2007 | Shields | |
| 7,715,515 B2 | 5/2010 | Olsson et al. | |
| 11,489,531 B2 * | 11/2022 | vor dem Brocke | H03L 7/0994 |
| 2006/0232471 A1 | 10/2006 | Coumou | |
| 2011/0115467 A1 | 5/2011 | Sato | |
| 2013/0170512 A1 | 7/2013 | Schmelzer et al. | |

FOREIGN PATENT DOCUMENTS

WO 2017001603 A2 1/2017

\* cited by examiner

*Primary Examiner* — Hai L Nguyen
(74) *Attorney, Agent, or Firm* — Dickinson Wright PLLC

(57) ABSTRACT

A device for synchronizing a periodic high frequency power signal (18) and an external reference signal (10). The device comprises a phase control circuit (100) and a digital oscillator circuit (130). The digital oscillator circuit (130) is connected to the phase control circuit (100). The digital oscillator circuit (130) comprises means for generating the periodic high frequency power signal (18) dependent on the control signal from the phase control circuit. The phase control circuit (100) is configured to determine a phase difference of the periodic high frequency power signal (18) and the external reference signal (10).

5 Claims, 3 Drawing Sheets

DEVICE AND METHOD FOR SYNCHRONIZING A HIGH FREQUENCY POWER SIGNAL AND AN EXTERNAL REFERENCE SIGNAL

CROSS-REFERENCE TO RELATED APPLICATIONS

The subject application is a continuation of U.S. application Ser. No. 16/904,629, filed on Jun. 18, 2020, now U.S. Pat. No. 11,165,338 issued on Nov. 2, 2021, which claims priority to EP 19182214.7 filed on Jun. 25, 2019, the entire disclosures of which are incorporated herein by reference

BACKGROUND OF THE INVENTION

The invention relates to a device for synchronizing a periodic high frequency power signal and an external reference signal. The device comprises a phase control circuit and a digital oscillator circuit, which is connected to the phase control circuit. The digital oscillator circuit comprises means for generating the periodic high frequency power signal dependent on the control signal from the phase control circuit. The phase control circuit is configured to determine a phase difference of the periodic high frequency power signal and the external reference signal.

Further, the invention relates to a method for synchronizing a periodic high frequency power signal and an external reference signal.

The device and the method can be used, for example, in radio-frequency power supplies.

Radio-frequency power supplies are commonly found in industry to generate and control plasma inside dedicated plasma processing chambers for etching or for deposition of material from or to a substrate (production of semiconductor memory chips, thin film displays and thin film photovoltaic cells are examples of industrial goods requiring or benefiting from plasma etching and plasma deposition processes).

Radio-frequency power supplies are also used to generate lasers, to power medical diagnostic equipment (magnetic resonance imaging for example), and to accelerate particles in research laboratories, to name just a few other applications.

Technical Background

The development of components for digital signal processing is steadily improving. More and more applications of processing signals in the radio frequency (RF) range are moving from the analog to the digital domain.

A frequency synthesizer, as a common signal generator, has been widely applied in many technical areas. Related researches have more and more requirements for the accuracy and stability of the frequency synthesizer, especially in the field of high frequency signal generators. With the development of signal generator technology, digital circuits have entered the field of signal synthesis, and the way of signal synthesis has made rapid progress, many signal synthesis methods have been designed. Modern synthetic signal methods include direct analog frequency synthesis, phase-locked frequency synthesis and direct digital frequency synthesis.

Phase-locked frequency synthesis uses one or more standard frequency sources to generate a large number of harmonics or combined frequencies by mixing and dividing harmonic generators. Then, the phase-locked loop (PLL) is used to lock the frequency of a voltage controlled oscillator (VCO) to a certain harmonic or combination frequency. The required frequency output is indirectly generated by the voltage-controlled oscillator.

A phase locked loop (PLL) is used to lock the output frequency of the voltage controlled oscillator (VCO) with the desired input frequency by constantly comparing the phase of the input frequency with that of the output frequency of the VCO. Further, the PLL is used to generate a signal, modulate or demodulate it. Basically the output frequency of the voltage controlled oscillator is constantly adjusted until it matches with the input frequency. The disadvantage of this method is its slow response to frequency changes.

In high-frequency applications, especially in such applications for carrying out a plasma process, there are further drawbacks regarding the generation of high-frequency signals. The jitter between the output signal and the sampling rate during a high-frequency measurement should be minimised in order to maximise the measurement or signal accuracy.

Usually, an external reference is directly connected to the frequency synthesizer input, for example a Direct Digital Synthesizer (DDS). Then, the frequency of this external reference has to be adapted by frequency dividing. Further, up-conversion of the frequency by using frequency multiplication was limited by the DDS-system's internal multiplication. Additionally, in this modus-operandi it was not possible to add a constant frequency offset. Therefore, the phase locked loop would mainly comprise analogue components. This made it difficult to reconfigure such a system at runtime.

Further, very fast analog-to-digital converters (ADC) are typically used regarding the generation of high-frequency signals. Disadvantageously, such very fast ADCs are very expensive.

State of the Art

WO 2017/001603 A2 discloses a device for generating a plurality of high-frequency signals. The device includes a reference signal generator, which is connected to an oscillator and generates at its output a reference signal with a reference frequency The device also includes at least one signal processor, for example, a DDS, which is connected to the reference frequency generator via a first signal line and to which the reference signal with the reference frequency is supplied.

Further devices or methods regarding frequency synthesizing in phase locked loops are known from U.S. Pat. No. 6,198,353 B1 or 7,250,823 B2.

Object of the Invention, Solution and Advantages

Object of the invention is to provide a device and a method improving frequency controlling by reducing the frequency converting time and ensuring low jitter of the generated high frequency output.

A further object of the present invention is to operate very fast processes by improving the structure and components of the circuitry related to synchronizing signals to save costs.

According to a first aspect of the invention this object is solved by a device for synchronizing a periodic high frequency power signal and an external reference signal, comprising a phase control circuit, a digital oscillator circuit, which is connected to the phase control circuit, and wherein the digital oscillator circuit comprises means for generating the periodic high frequency power signal dependent on the control signal from the phase control circuit, and wherein the phase control circuit is configured to determine a phase difference of the periodic high frequency power signal and the external reference signal.

It is understood that an "external reference signal" in this patent application is any available periodic signal, which has a well-defined and time-invariant frequency and which can therefore be used as a reference for frequency and time.

This allows a faster synchronization regarding a constant phase and/or frequency relationship of internal signals to external clock signals using the inventive device. This device can advantageously be used to synchronize the RF output or CEX (short term for common exciter). Further, the constant reference output of the inventive device can be advantageously used as a reference input to synchronize another unit like a RF generator or RF amplifier.

Further, this synchronization allows improving the digital phase locked loop based on a fixed phase relationship if the reference input and internal signal are configured to work at the same frequency. Alternatively, a fixed frequency ratio of the reference input and the internal signals can be achieved.

Furthermore, this device advantageously allows a faster and broader frequency up-conversion and/or down-conversion of the reference signal frequency.

Further, this allows controlling the frequency or phase of the internally generated signal faster using a frequency tuning word (FTW). A FTW is a parameter, which is proportional to the output of the DDS.

In a first embodiment according to the first aspect of the invention the device further comprises an analog-to-digital converter, which is connected to the digital oscillator circuit. The analog-to-digital converter comprises an output, which comprises a digital control signal. The digital oscillator circuit further comprises a signal processing circuit, which is connected to the analog-to-digital converter. The signal processing circuit is configured to regulate a frequency tuning word dependent on a value of the digital control signal, wherein the value of the digital control signal is in relation to a preset reference value range of the digital control signal. The phase control circuit comprises a phase detector comprising means for determining a phase difference of the periodic high frequency power signal and the external reference signal.

This allows reducing the drifting of the output phase of the generated signal faster and more efficiently by driving the output signal of the digital oscillator in the opposite direction so as to reduce the error signal caused by the drifted output phase. Thus, the output phase of the generated high frequency power signal is locked to the phase at the other input signal, which is the reference signal.

Further, using an analog-to digital converter (ADC) allows to match the bandwidth and required signal-to-noise-ratio (SNR) of the signal to be digitized in an advantageous way. If an ADC operates at a sampling rate greater than twice the bandwidth of the signal, then per the Nyquist-Shannon sampling theorem, a perfect reconstruction of the digitized signal is possible.

In a second embodiment according to the first aspect of the invention the signal processing circuit comprises an activation circuit for activating a frequency tuning word. The activation circuit is activated in case the value of the digital control signal is outside a preset reference value range. The preset reference value range of the digital control signal is preset between 0.1 to 0.9 of the reference value, preferably between 0.25 to 0.75 of the reference value.

This allows a faster tuning of the frequency tuning word. Further, this allows a more effective fine tuning because the "fine frequency tuning word" is advantageously kept in a safe or working area for driving the digital oscillator.

In a third embodiment according to the first aspect of the invention the device further comprises a loop filter connected between the phase detector and the analog-to-digital converter.

This allows to advantageously determine disturbances; such as changes in the reference frequency or phase. Using a loop filter allows a faster lock time, lock-up time or settling time of the phase locked loop (PLL).

In a fourth embodiment according to the first aspect of the invention the device further comprises a signal processing circuit, which is connected to the phase control circuit. The signal processing circuit comprises means for determining a phase difference of the periodic high frequency power signal and the external reference signal. The phase control circuit comprises a first counter and a second counter.

In a fifth embodiment according to the first aspect of the invention the means for determining a phase difference are configured to calculate the counting difference of the two counters for determining the phase difference.

In a sixth embodiment according to the first aspect of the invention the means for determining a phase difference are further configured to calculate the counting difference of the two counters at the rising edge of a clock signal to be selected.

In a seventh embodiment according to the first aspect of the invention the digital oscillator circuit comprises a digital-to-analog converter, which is connected to the digital oscillator circuit. The output of the digital-to-analog converter has the periodic high frequency power signal.

This allows to advantageously produce an efficiently modulated output that can be similarly filtered to produce a smoothly varying output signal.

In an eighth embodiment according to the first aspect of the invention the digital oscillator circuit and the digital-to-analog converter are located on a dedicated chip or are separated.

In a ninth embodiment according to the first aspect of the invention the digital oscillator circuit further comprises a direct digital synthesizer circuit.

In a tenth embodiment according to the first aspect of the invention the direct digital synthesizer circuit comprises a phase accumulator and a sine look up table.

In an eleventh embodiment according to the first aspect of the invention at least the signal processing circuit is located on a programmable logical circuit.

In a twelfth embodiment according to the first aspect of the invention the programmable logical circuit is a field programmable gate array (FPGA) or a System on Chip (SoC) or an application-specific integrated circuit (ASIC).

In a thirteenth embodiment according to the first aspect of the invention the generated high frequency power signal has a frequency equal or smaller than 100 MHz, preferably between 400 KHz and 100 MHz.

In a fourteenth embodiment according to the first aspect of the invention the periodic high power frequency signal is a square-, triangular-, or sinusoidal signal.

According to a second aspect of the invention a method for synchronizing a periodic high frequency power signal and an external reference signal comprises the steps of determining a phase difference of the periodic high frequency power signal and the external reference signal, regulating a frequency tuning word dependent on a value of the digital control signal, wherein the value of the digital control signal is in relation to a preset reference value range of the digital control signal, generating the periodic high frequency power signal at a digital oscillator circuit, routing the periodic high frequency power signal to a phase control circuit for synchronizing the two signals.

This allows a faster synchronization regarding a constant phase and/or frequency relationship of internal signals to external clock signals using the inventive method. Using the method allows synchronizing the RF output or CEX (short term for common exciter).

Further, this synchronization allows improving the digital phase locked loop based on a fixed phase relationship if the reference input and internal signal are configured to work at the same frequency.

Furthermore, this method advantageously allows a faster and broader frequency up-conversion and/or down-conversion of the reference signal frequency.

Further, this allows to faster controlling the frequency or phase of the internally generated signal using the frequency tuning word (FTW).

In a first embodiment according to the second aspect of the invention the method comprises the further step, wherein the preset reference value range of the digital control signal is preset between 0.1 to 0.9 of the reference value, preferably between 0.25 to 0.75 of the reference value.

In a second embodiment according to the second aspect of the invention the method comprises the step of activating a frequency tuning word at an activation circuit, in case a value of the digital control signal is outside a preset reference value range.

According to a third aspect of the invention a method for synchronizing a periodic high frequency power signal and an external reference signal, wherein a phase control circuit comprises a first counter and a second counter, comprises the steps of determining a phase difference of the periodic high frequency power signal and the external reference signal by calculating a counting difference of the two counters, generating a frequency tuning word, which is routed to a digital oscillator circuit, generating the periodic high frequency power signal at a digital oscillator circuit dependent on the frequency tuning word, routing the periodic high frequency power signal to a phase control circuit for synchronizing the two signals.

In a first embodiment according to the third aspect of the invention the method comprises the further step of determining the phase difference of the periodic high frequency power signal and an external reference signal by calculating the counting difference of the two counters at the rising edge of a clock signal to be selected.

BRIEF DESCRIPTION OF THE DRAWINGS

The invention will be described below with reference to different exemplary embodiments explained in detail in the following drawings.

DETAILED DESCRIPTION OF THE ENABLING EMBODIMENTS

Figure 1A:
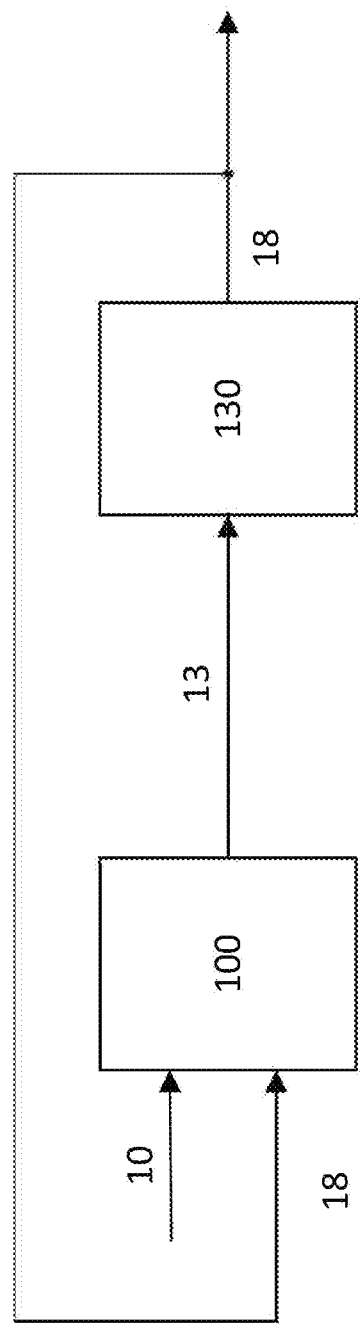
FIG. 1a depicts a schematic diagram of an embodiment of the invention.

FIG. 1a depicts a schematic diagram of an embodiment of the invention comprising a phase control circuit 100 and a digital oscillator circuit 130. The output of the digital oscillator circuit 130 has a periodic high frequency power signal 18. The digital oscillator circuit 130 is connected to the phase control circuit 100 and comprises means for generating the periodic high frequency power signal 18, which is dependent on the control signal 13 from the phase control circuit 100.

The phase control circuit 100 has one output and two inputs. The output has the control signal 13. One input has an external reference signal 10 and the other input has the periodic high frequency power signal 18. The signal 18 is looped back from the output of the circuit 130. Such a loop is generally called a feedback or control loop or a phase locked loop (PLL).

Generally, a phase locked loop (PLL) is a control loop that synchronizes an oscillator in frequency and phase with an input signal. If the two signals are synchronized, the phase shift between the two is a fixed value. If there is a phase shift between the two signals that does not correspond to the fixed value, the oscillator is re-adjusted until the phase shift again corresponds to this value.

As shown in FIG. 1a the PLL consists of a phase control circuit 100 and a digital oscillator circuit 130. The schematic diagram in FIG. 1a shows how these circuits or elements are connected in order to form a PLL.

Figure 1B:
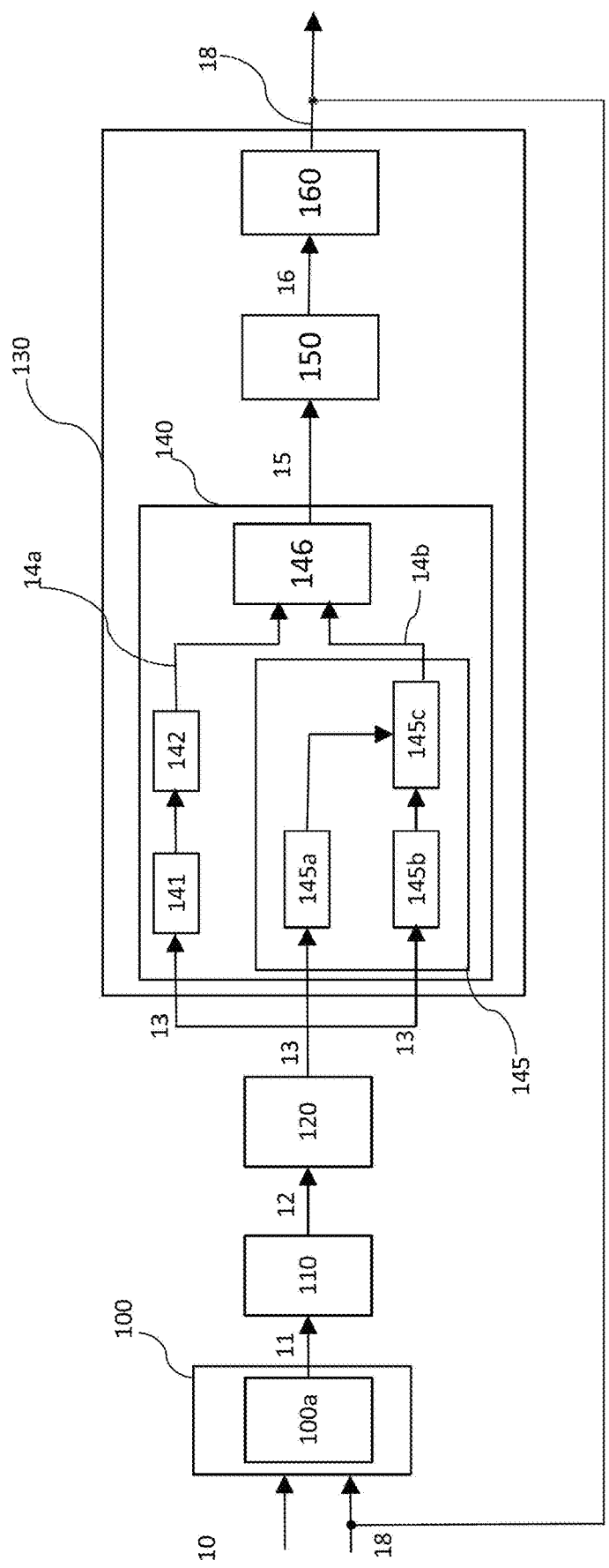
FIG. 1b depicts schematically a further embodiment of the invention.

FIG. 1b depicts schematically a further embodiment of the invention comprising the phase control circuit 100 and the digital oscillator circuit 130. The phase control circuit 100 comprises a phase detector 100a. The device further comprises an optional loop filter 110 and an analog-to digital converter 120. The digital oscillator circuit 130 comprises a signal processing circuit 140, a direct digital synthesizer circuit 150 and a digital-to analog-converter 160. The schematic diagram in FIG. 1b shows how these elements are connected in order to form a PLL.

The phase detector 100a compares the two input signals 10, 18, for example an external reference signal 10 and a high frequency power signal 18. The signal 18 is generated by the digital oscillator circuit 130 and looped back to one of the inputs of the phase detector 100a.

Based on the comparison of the two signals 10, 18, the phase detector 100a produces an error signal 11. The signal 13 is proportional to the phase difference of the two signals 10, 18. The phase difference is performed by a combination of flip-flop components of the phase detector 100a. Optionally, the error signal 11 can further be low-pass filtered using a so called loop filter 110. The error signal 11 is used to drive the digital oscillator circuit 130, which creates the output signal 18. This output 18 is fed back to one of the inputs of the phase detector, producing a feedback loop or a so called phase locked loop (PLL). As an option, the generated high frequency power signal 18 can be fed back through an optional divider of the phase control circuit 100 (not shown in FIG. 1b).

For example, if the output phase of the generated signal 18 drifts, the error signal 11 will increase, driving the signal 18 of the digital oscillator 130 in the opposite direction so as to reduce the error. Thus, the output phase of the generated high frequency power signal 18 is locked to the phase at the other input signal, which is the reference signal 10.

As shown in FIG. 1b a loop filter 110 or PLL loop filter 110 is connected between the phase detector 100a and the analog-to-digital converter 120. The loop filter optionally can be configured as a low pass filter.

One function of the loop filter 110 is to determine disturbances, such as changes in the reference frequency or phase. Further, when specifying a loop filter the following points should be considered like the range over which the loop can achieve lock (pull-in range, lock range or capture range) or how fast the loop achieves lock time, lock-up time or settling time. Depending on the application, this may require one or more of the following: a simple proportion like gain or attenuation, an integral like a low pass filter and/or a derivative like high pass filter.

The second function of the loop filter 110 is limiting the amount of reference frequency energy (ripple) appearing at the phase detector output, that is then applied to one of the inputs of the oscillator circuit 130.

The analog-to-digital converter 120 (ADC) converts a continuous-time and continuous-amplitude analog signal 12 to a digital control signal 13, which can be discrete-time and/or discrete-amplitude. The conversion involves quantization of the input, which can cause some amount of error or noise. Further, instead of continuously performing the conversion, an ADC 120 optionally converts periodically, sampling the input, limiting the allowable bandwidth of the input signal. The ADC 120 is characterized by its bandwidth and signal-to-noise ratio (SNR). The bandwidth of an ADC is given by its sampling rate.

The direct digital synthesizer circuit 150 generates a periodical signal y(t) 16, which for example is sinusoidal. The circuit 150 comprises two parts. One part is for example an angle counter. This counter generates the angle $\theta y(t)$ of the signal y(t). It is essentially a counter that counts in the range of 0 to $2\pi$. On each clock cycle, the circuit 150 increments its counter by an amount equal to the value of the loop filter output. That is, $\theta y(t)=\theta y(t-1)+\varepsilon loop(t)$. Thus the loop filter output represents the change in the digital oscillator output's angle and can be written as $\varepsilon loop(t)=\Delta\theta y(t)$.

Once the PLL has converged, the ideal loop filter output will be $\varepsilon loop(t)=\Delta\theta y(t)=\Delta\theta x=2\pi fx d\Delta t$ where $\Delta t$ represents the amount of time between samples. In other words, once the PLL has converged, the rate of change of the locally generated angle $\theta y(t)$ will equal the rate of the change of the received signal angle $\theta x(t)$.

The circuit 150 comprises as a second part the digital signal generator, which is a sine lookup table that outputs the sine or cosine of its input signal. By connecting the output of the angle counter to the digital signal generator, the circuit 150 is able to generate the output signal $y(t)=\cos(\theta y(t))$. In practice, the loop filter integrator is often pre-loaded with an estimate of $\Delta\theta x(t)$ so that the locally generated signal y(t) starts out near the frequency of x(t).

The DDS circuit 150 as shown in FIG. 1a is a combination of a phase-accumulator with following addition of a phase-offset and a sine-lookup-table (LUT) (not shown in FIG. 1a). The amplitude of the signal can be controlled via a multiplication of a (varying) factor with the output of the sine-LUT.

The digital oscillator circuit 130 further comprises a signal processing circuit 140, which is connected to the digital-to-analog converter 120 and the direct digital synthesizer circuit 150. The signal processing circuit 140 comprises an activation circuit 145 for activating a frequency tuning word 15 (FTW).

The activation circuit 145 comprises logical components 145a, 145b and 145c, which are used for activating a coarse tuning of the frequency tuning word 15. These logical components may include one or more adding components, one or more differentiator components, one or more integrator components, "Tresh & Activate components" or any other logical component or number of logical components.

In case the loop filter 110 clips at GND/VCC the regulation of the frequency tuning word would be inactive. To avoid this effect a certain level or reference value can be specified and also configured or pre-set as a reference value in the ADC 120. If a certain value or level of the reference value at the ADC output is reached an Integrator 145c is activated. This pulls a "coarse FTW" 14b at an adding component 146 to a value in relation to the pre-set reference value so that the tuning of the "fine FTW" 14a can work in a safe area.

The signal processing circuit 140, especially the activation circuit 145, activates a more or less precise tuning dependent on the deviation regarding a preset reference value or reference ADC value or maximum ADC value. The deviation can be specified by a range between a low and a maximum level of the preset reference value or maximum value of the ADC output.

The activation circuit 145 is activated in case the actual value 13 at the output of the ADC or the digital control signal 13 is outside a pre-set range regarding the reference value. For example, if the actual value 13 is below or above this range the coarse tuning is activated by the activation circuit 145. For example, the range can be defined as between 0.1 of the preset reference value or preset maximum ADC value as a first activation level and 0.9 of the preset reference value or preset maximum reference value as a second activation level. Optionally, the range is specified between 0.25 of the preset reference value or preset maximum ADC value as a first activation level and 0.75 of the preset reference value or preset maximum reference value as a second activation level.

The activation of the coarse tuning is dependent on the digital control signal 13 of the ADC 120 or the ADC value 13, which is transmitted from of the analog-to-digital converter 120 to the input of the digital oscillator circuit 130.

Optionally, the device may comprise a divider (not shown), which is usually located in the feedback path of the PLL. As an example, the divider (dividing by 4 or any other natural division factor) can be used to generate a fraction or a multiple of the generated signal 18 or the reference signal 10.

As shown in FIG. 1b the device also comprises a digital-to-analog converter 160. The digital-to-analog converter 160 (DAC) is an element that converts a digital signal into an analog signal, for example a high frequency power signal 18. A DAC 160 converts an abstract number into a physical quantity e.g., a voltage. In particular, DACs are often used to convert finite-precision time series data to a continually varying physical signal.

An ideal DAC converts the abstract numbers into a conceptual sequence of impulses that are then processed by a reconstruction filter using some form of interpolation to fill in data between the impulses. A conventional practical DAC converts the numbers into a piecewise constant function made up of a sequence of rectangular functions that is modeled with the zero-order hold.

Figure 2:
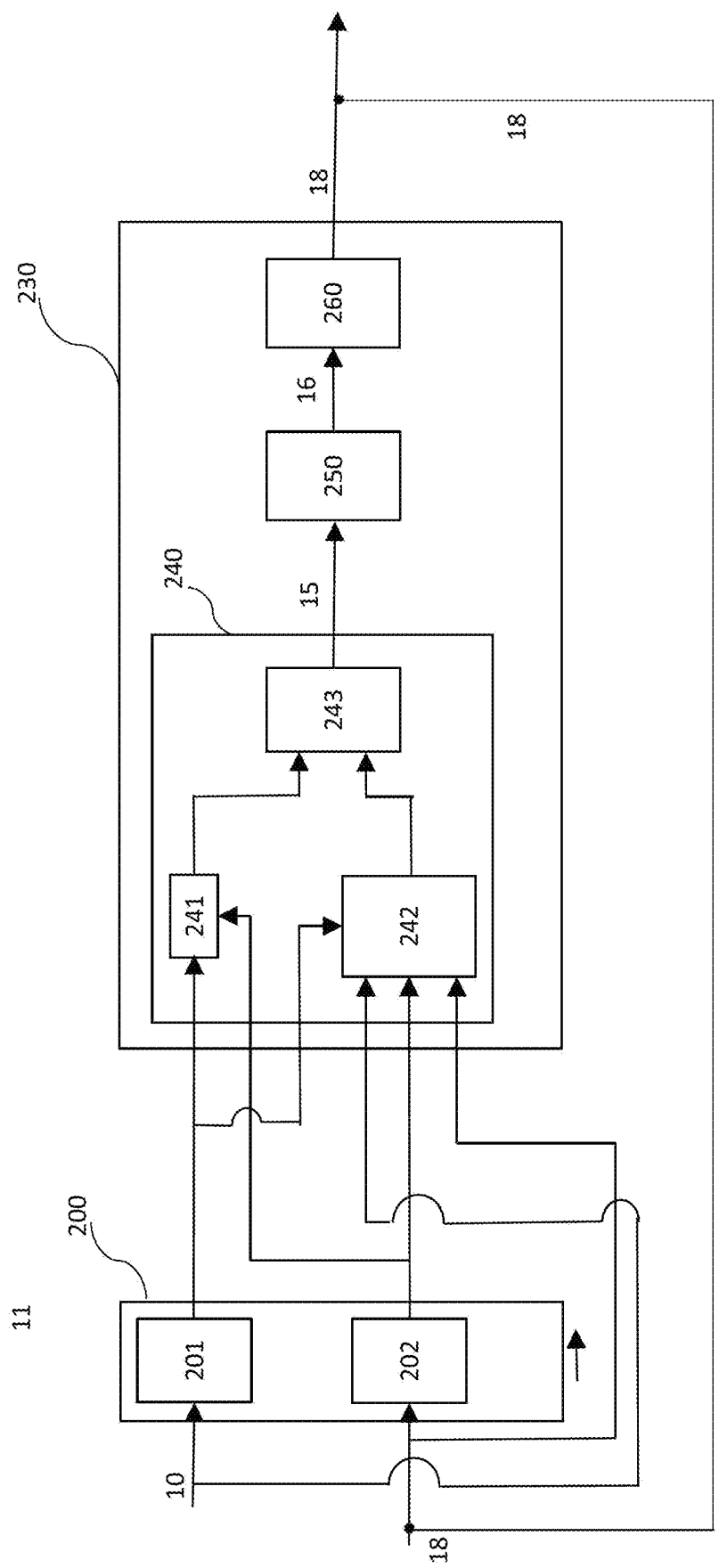
FIG. 2 depicts schematically a further embodiment of the invention.

FIG. 2 depicts schematically a further embodiment of the invention comprising the phase control circuit 200 and the digital oscillator circuit 230. The phase control circuit 200 comprises a first counter 201 and a second counter 202. The digital oscillator circuit 230 comprises a signal processing circuit 240, a direct digital synthesizer circuit 250 and a digital-to analog-converter 260. The schematic diagram in FIG. 2 shows how these elements are connected in order to form a PLL.

The direct digital synthesizer circuit 250 in FIG. 2 corresponds to the direct digital synthesizer circuit 150 in FIG. 1b. The same applies to the digital-to-analog converter 160, 260 in FIG. 1b and FIG. 2.

The function of the direct digital synthesizer circuit 250 is explained as follows: The circuit 250 comprises a phase accumulator and a sine look up table (LUT) (Both not shown), optionally further or other digital components can be used. The accumulator itself first outputs a number p of the word width P at its output, which corresponds to the current phase of the waveform on the circle. In general, P<N is selected. This is followed by mapping the number p to the desired sample w of the waveform with the word width W. The waveform is digitally stored in a memory with 2P samples. The current value p forms the address for this memory and is thus mapped to the desired waveform. The waveform can be arbitrary, but mostly the sine or cosine form is used.

The resulting sampled values must then be converted to the desired waveform using a digital-to-analog converter 260 of the word width W. Depending on the number (P) and word width (W) of the sampled values, a very pure signal spectrum can be created.

The phase control circuit 200 compares the two input signals 10, 18, for example an external reference signal 10 and a high frequency power signal 18. The signal 18 is generated by the digital oscillator circuit 230 and looped back to one of the inputs of the phase control circuit 200.

Different to the phase control circuit 100 in FIG. 1b the phase control circuit 200 shown in FIG. 2 comprises two counters 201, 202 for comparing the phase difference of the two signals 10, 18. Each counter is configured to count frequency and phase The phase difference is determined by calculating the counting difference of the two counters 201, 202 by using means 241, 242 and 243 of the signal processing circuit 240.

The external reference signal 10 and the looped backed high frequency power signal 18 are fed to the differentiator component 241.

The first counter 201 and the second counter 202 each divide the frequency of the signals by a natural division factor and so each counter allows the generation of fraction/multiples of the input signals.

The differentiator 241 and the flip-flop 243 calculate the actual difference of the two counters 201, 202 at the rising edge of the clock signal selected by the Multiplexer 242. A phase and/or frequency lock is achieved, in case the difference of the two counters 201, 202 is constant.

It should be expressly noted that one subject matter of invention can be advantageously combined with another subject matter of the above aspects of the invention and/or with features shown in the drawings, namely either individually or in any combination cumulatively.

LIST OF REFERENCE SIGNS

10 External reference signal
11 PWM-signal
13 Digital control signal, ADC value
14a Fine Frequency Tuning Word
14b Coarse Frequency Tuning Word
15 Frequency tuning word
16 Digital signal
17 Clock signal
18 High frequency power signal
19 Output signal (RF Out)
100 Phase control circuit
100a Phase detector
110 Loop filter
120 Analog-to-digital converter
130 Digital oscillator circuit
140 Signal processing circuit
141 Filter component
142 Gain Component
145 Activation circuit
145a Tresh & Activate component
145b Differentiator component
145c Integrator
146 Adding component, Adder
150 Direct digital synthesizer circuit
160 Digital-to-analog converter
200 Phase control circuit
201 First counter
202 Second Counter
240 Signal processing circuit
241 Differentiator
242 Multiplexer
243 Flip-Flop
250 direct digital synthesizer circuit
260 Digital-to-analog converter

The invention claimed is:

1. A device for synchronizing a frequency signal and an external reference signal, comprising:
   a phase control circuit;
   a digital oscillator circuit connected to the phase control circuit and comprising means for generating the frequency signal;
   the phase control circuit including a first counter for receiving the external reference signal and a second counter for receiving the frequency signal; and
   the digital oscillator circuit including a signal processing circuit for receiving output signals of the first counter and the second counter and comprising means for determining a phase difference of the frequency signal and the external reference signal.

2. The device according to claim 1, wherein the means for determining the phase difference are configured to calculate a counting difference of the first and second counters for determining the phase difference.

3. The device according to claim 2, wherein the means for determining the phase difference are further configured to calculate the counting difference of the first and second counters at the rising edge of a clock signal to be selected.

4. A method for synchronizing a frequency signal and an external reference signal, wherein a phase control circuit comprises a first counter and a second counter, the method comprising the steps of:
   determining a phase difference of the frequency signal and the external reference signal by calculating a counting difference of the first and second counters;
   generating a frequency tuning word which is routed to a digital oscillator circuit;
   generating the frequency signal at the digital oscillator circuit dependent on the frequency tuning word; and
   routing the frequency signal to the phase control circuit for counting frequency and phase of the two signals.

5. The method according to claim 4, wherein the step of determining the phase difference of the frequency signal and the external reference signal includes calculating the counting difference of the first and second counters at the rising edge of a clock signal to be selected.

* * * * *